(12) United States Patent
Li et al.

(10) Patent No.: US 12,150,348 B2
(45) Date of Patent: Nov. 19, 2024

(54) DISPLAY SUBSTRATE AND PREPARATION METHOD THEREOF, AND DISPLAY APPARATUS

(71) Applicant: BOE Technology Group Co., Ltd., Beijing (CN)

(72) Inventors: Xin Li, Beijing (CN); Xing Fan, Beijing (CN); Jing Yang, Beijing (CN); Jiangnan Lu, Beijing (CN); Yansong Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 552 days.

(21) Appl. No.: 17/598,894

(22) PCT Filed: Dec. 23, 2020

(86) PCT No.: PCT/CN2020/138714
§ 371 (c)(1),
(2) Date: Sep. 28, 2021

(87) PCT Pub. No.: WO2022/133829
PCT Pub. Date: Jun. 30, 2022

(65) Prior Publication Data
US 2022/0399411 A1 Dec. 15, 2022

(51) Int. Cl.
*H10K 71/00* (2023.01)
*H10K 50/86* (2023.01)
(Continued)

(52) U.S. Cl.
CPC ......... *H10K 59/122* (2023.02); *H10K 50/865* (2023.02); *H10K 71/00* (2023.02); *H10K 59/1201* (2023.02)

(58) Field of Classification Search
CPC .... H10K 59/122; H10K 71/00; H10K 50/865; H10K 59/1201
See application file for complete search history.

(56) References Cited

U.S. PATENT DOCUMENTS 11,081,075 B2 *  8/2021  Lee ..................... G09G 3/3677
2018/0122875 A1  5/2018  Bang et al.
(Continued)

FOREIGN PATENT DOCUMENTS

CN      106848095 A    6/2017
CN      107706221 A    2/2018
(Continued)

*Primary Examiner* — Richard A Booth
(74) *Attorney, Agent, or Firm* — Ling Wu; Stephen Yang; Ling and Yang Intellectual Property

(57) ABSTRACT

Provided are a display substrate, a preparation method thereof and a display apparatus. The display substrate includes a substrate and a plurality of pixel units disposed in matrix on the substrate, wherein each pixel unit includes a plurality of sub-pixels, and each sub-pixel includes a driving structure layer, a first electrode and a first pixel define layer on the driving structure layer, and a light absorption layer disposed on the first pixel define layer. The first pixel define layer includes a plurality of first barriers and first pixel openings disposed between the first barriers, the first pixel opening exposes at least part of the first electrode, and the first pixel opening includes a first surface close to the first electrode, a second surface opposite to the first surface and a first sidewall between the first and second surfaces.

8 Claims, 9 Drawing Sheets

(51) Int. Cl.
*H10K 59/122* (2023.01)
*H10K 59/12* (2023.01)

(56) References Cited

U.S. PATENT DOCUMENTS

| | | |
|---|---|---|
| 2019/0148675 A1 | 5/2019 | Kudo et al. |
| 2019/0288043 A1 | 9/2019 | Shin et al. |
| 2020/0136047 A1 | 4/2020 | Tang et al. |
| 2021/0057671 A1 | 2/2021 | Gao et al. |
| 2023/0106236 A1* | 4/2023 | Wen ................. H10K 71/00 257/40 |

FOREIGN PATENT DOCUMENTS

| | | |
|---|---|---|
| CN | 108022952 A | 5/2018 |
| CN | 109817676 A | 5/2019 |
| CN | 110277507 A | 9/2019 |
| CN | 110289284 A | 9/2019 |
| CN | 110459570 A | 11/2019 |
| CN | 111081745 A | 4/2020 |
| CN | 111584608 A | 8/2020 |
| CN | 111682048 A | 9/2020 |

\* cited by examiner

DISPLAY SUBSTRATE AND PREPARATION METHOD THEREOF, AND DISPLAY APPARATUS

TECHNICAL FIELD

The present disclosure relates to, but is not limited to, the field of display technology, in particular to a display substrate and a preparation method thereof, and a display apparatus.

BACKGROUND

An organic light-emitting diode (OLED) is an active light-emitting display device, and has advantages of self-emission, wide view angle, high contrast, low power consumption, extremely high response speed, etc. With continuous development of the display technology, a flexible display apparatus with OLEDs as light-emitting devices and thin film Transistors (TFTs) for performing signal controlling has become a mainstream product in the current display field.

SUMMARY

The following is a summary of subject matter described in detail herein. This summary is not intended to limit the protection scope of claims.

Exemplary embodiments of the present disclosure provide a display substrate, including: a substrate and a plurality of pixel units disposed in matrix on the substrate, wherein each pixel unit includes a plurality of sub-pixels, and each sub-pixel includes a driving structure layer on the substrate, a first electrode and a first pixel define layer on the driving structure layer, and a light absorption layer disposed on the first pixel define layer, wherein the driving structure layer includes a thin film transistor, and the drain electrode of the thin film transistor is connected to the first electrode; the first pixel define layer includes a plurality of first barriers and a first pixel opening disposed between the first barriers, the first pixel opening exposes at least part of the first electrode, and the first pixel opening includes a first surface close to the first electrode, a second surface opposite to the first surface and a first sidewall between the first surface and second surface; the first pixel opening communicates with the first surface and the second surface; the light absorption layer covers the first barriers and at least part of the first sidewall.

In an exemplary embodiment, the edge of an orthographic projection of the light absorption layer on the substrate coincides with the edge of an orthographic projection of the first surface on the substrate, or the edge of an orthographic projection of the light absorption layer on the substrate is located outside the orthographic projection of the first surface on the substrate; and the edge of the orthographic projection of the light absorption layer on the substrate is located within an orthographic projection of the second surface on the substrate.

In an exemplary embodiment, the display substrate further includes a second pixel define layer disposed on the light absorption layer, and the second pixel define layer covers the light absorption layer; the second pixel define layer includes a plurality of second barriers and second pixel opening disposed between the second barriers, and the second pixel opening exposes at least part of the first electrode.

In an exemplary embodiment, the second pixel opening includes a third surface close to the first electrode, a fourth surface opposite to the third surface, and a second sidewall between the third surface and fourth surface, and the second pixel opening communicates with the third surface and the fourth surface; the orthographic projection of the third surface on the substrate is overlapped with the orthographic projection of the first surface on the substrate, or the orthographic projection of the third surface on the substrate is within the range of the orthographic projection of the first surface on the substrate.

In an exemplary embodiment, the first sidewall forms a first slope angle with the plane on which the substrate is located, and the second sidewall includes a first side surface close to the first electrode and a second side surface away from the first electrode; the first side surface forms a second slope angle with the plane on which the substrate is located, and the second slope angle is greater than the first slope angle.

In an exemplary embodiment, the first pixel define layer has a thickness of 0.5 to 1.5 microns, the light absorption layer has a thickness of 0.5 to 1 micron, and the second pixel define layer has a thickness of 0.2 to 0.6 microns.

In an exemplary embodiment, the light absorption layer is made of a light absorbing material or a pixel define layer material doped with light absorbing particles, wherein the light absorbing particles are carbon black particles or black chromium particles, and the pixel define layer material is polyimide, acrylic or polyethylene terephthalate.

An exemplary embodiment of the present disclosure further provides a display apparatus, including any aforementioned display substrate.

An exemplary embodiment of the present disclosure further provides a preparation method for a display substrate, which includes: forming a driving structure layer and a first planarization layer on the substrate; forming a first electrode and a first pixel define layer on a first planarization layer, wherein the first pixel define layer includes a plurality of first barriers and a first pixel opening disposed between the first barriers, the first pixel opening exposes at least part of the first electrode, and the first pixel opening includes a first surface close to the first electrode, a second surface opposite to the first surface and a first sidewall between the first surface and second surface; the first pixel opening communicates with the first surface and the second surface; forming a light absorption layer on the first pixel define layer, wherein the light absorption layer covers the first barriers and at least part of the first sidewall; sequentially forming an organic light-emitting layer, a second electrode and an encapsulation layer.

In an exemplary embodiment, the first pixel define layer is formed by a positive photolithography technique, and the light absorption layer is formed by a negative photolithography technique.

In an exemplary embodiment, the edge of an orthographic projection of the light absorption layer on the substrate coincides with the edge of an orthographic projection of the first surface on the substrate, or the edge of the orthographic projection of the light absorption layer on the substrate is located outside the orthographic projection of the first surface on the substrate; and the edge of the orthographic projection of the light absorption layer on the substrate is located within an orthographic projection of the second surface on the substrate.

In an exemplary embodiment, before sequentially forming the organic light-emitting layer, the second electrode and the encapsulation layer, the preparation method further includes:

forming a second pixel define layer on the light absorption layer, wherein the second pixel define layer covers the light absorption layer; the second pixel define layer includes a plurality of second barriers and a second pixel opening disposed between the second barriers, and the second pixel opening exposes at least part of the first electrode.

In an exemplary embodiment, the second pixel opening includes a third surface close to the first electrode, a fourth surface opposite to the third surface, and a second sidewall between the third and fourth surfaces, and the second pixel opening communicates with the third surface and the fourth surface; the orthographic projection of the third surface on the substrate is overlapped with the orthographic projection of the first surface on the substrate, or the orthographic projection of the third surface on the substrate is within the range of the orthographic projection of the first surface on the substrate.

Other aspects will be understood after the drawings and the detailed description are read and understood.

BRIEF DESCRIPTION OF DRAWINGS

Accompanying drawings are used to provide a further understanding of technical solutions of the present disclosure and constitute a part of the specification to explain the technical solutions of the present disclosure together with embodiments of the present disclosure, and do not constitute any limitation on the technical solutions of the present disclosure. Shapes and sizes of various components in the drawings do not reflect true scales and are intended to illustrate schematically contents of the present disclosure only.

DETAILED DESCRIPTION

Figure 1:
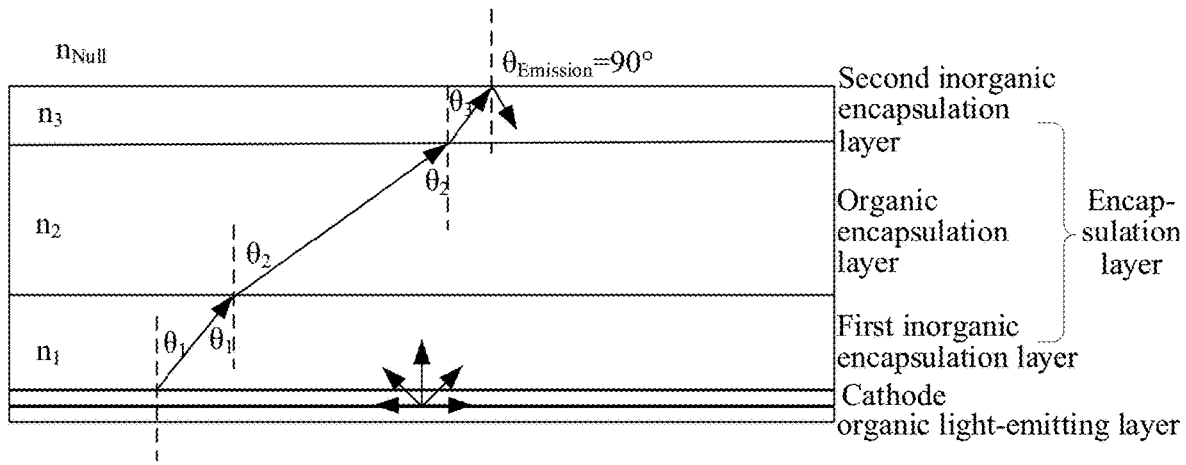
FIG. 1 is a schematic diagram of the principle of waveguide light in a display substrate.

To make the objects, technical solutions and advantages of the present disclosure more clear, embodiments of the present disclosure will be described in detail below with reference to the drawings. It should be noted that the embodiments may be implemented in many different forms. Those of ordinary skills in the art may readily understand the fact that implementations and contents may be transformed into a variety of forms without departing from the spirit and scope of the present disclosure. Therefore, the present disclosure should not be construed as being limited only to what is described in the following embodiments. The embodiments and features in the embodiments in the present disclosure may be combined randomly if there is no conflict.

In the drawings, sizes of various constituent elements and thicknesses and regions of layers are sometimes exaggerated for clarity. Therefore, an implementation of the present disclosure is not necessarily limited to the sizes shown. The shapes and sizes of various components in the drawings do not reflect true scales. In addition, the drawings schematically show ideal examples, and an implementation of the present disclosure is not limited to the shapes or values shown in the drawings.

The ordinal numbers "first", "second", "third" and the like in this specification are used to avoid confusion between constituent elements, but not to constitute limitations on quantities.

In this specification, for sake of convenience, wordings, such as "central", "upper", "lower", "front", "rear", "vertical", "horizontal", "top", "bottom", "inner", "outer" and the like which are used to indicate orientation or positional relations, to describe the positional relations between constituent elements with reference to the drawings, are only for a purpose of facilitating description of this specification and simplifying the description, rather than indicating or implying that the device or element referred to must have a specific orientation, or must be constructed and operated in a particular orientation, and therefore cannot be construed as limitations on the present disclosure. The positional relations between the constituent elements are appropriately changed according to the directions the constituent element described. Therefore, the wordings are not limited in the specification, and may be replaced appropriately according to situations.

In this specification, terms "install", "connect" and "couple" shall be understood in a broad sense unless otherwise explicitly specified and defined. For example, a connection may be a fixed connection, or a detachable connection, or an integrated connection; it may be a mechanical connection, or an electrical connection; it may be a direct connection, or an indirect connection through middleware, or an internal connection between two elements. For those of ordinary skills in the art, the specific meanings of the above terms in the present disclosure may be understood according to specific situations.

In this specification, a transistor refers to an element including at least three terminals, namely a gate electrode, a drain electrode and a source electrode. The transistor has a channel region between the drain electrode (a drain electrode terminal, a drain region or a drain electrode) and the source electrode (a source electrode terminal, a source region or a source electrode), and current may flow through the drain electrode, the channel region and the source electrode. It should be noted that in this specification, the channel region refers to a region through which current mainly flows.

In this specification, the first electrode may be a drain electrode and the second electrode may be a source electrode, or the first electrode may be a source electrode and the second electrode may be a drain electrode. Functions of the "source electrode" and the "drain electrode" are sometimes interchangeable in a case where transistors with opposite polarities are used or in a case where the current direction changes during circuit operation. Therefore, in this specification, "source electrode" and "drain electrode" are interchangeable.

In this specification, an "electrical connection" includes a case where constituent elements are connected together through an element with a certain electric action. The "element having a certain electrical action" is not particularly limited as long as it may transmit and receive electrical signals between connected constituent elements. Examples of the "element with a certain electric action" include not only electrodes and wirings, but also switching elements such as transistors, resistors, inductors, capacitors, and other elements having various functions.

In this specification, "parallel" refers to a case where an angle formed by two straight lines is above −10 degrees and below 10 degrees, and thus also includes a case where the angle is above −5 degrees and below 5 degrees. In addition, "vertical" refers to a state in which two straight lines form an angle above 80 degrees below 100 degrees, and thus also includes a state in which the angle is above 85 degrees and below 95 degrees.

In this specification, "film" and "layer" may be interchangeable. For example, sometimes "conductive layer" may be replaced by "conductive film". Similarly, "insulating film" may sometimes be replaced by "insulating layer".

OLED display device is a self-luminous display device. Compared with conventional liquid crystal display, OLED display device has obvious advantages such as high brightness, high contrast, high saturation color and high response rate. Existing OLED displays mostly has a top-emission device structure, which is mostly formed with a semi-reflective cathode, a fully-reflective anode, and an organic light-emitting layer in the middle. The cathode and anode form a reflective microcavity, which generates microcavity effect on the light-emitting characteristics, and causes the light emitted by the organic light-emitting layer to form strong interference within multiple beams in the cavity, and further narrows the emission spectrum and haves a good modulation effect on the peak wavelength of the emission spectrum.

An OLED display panel includes a substrate, a driving structure layer, a planarization layer, an anode, a pixel define layer, an organic light-emitting layer, a cathode and an encapsulation layer which are sequentially disposed on the substrate. The encapsulation layer may include a first inorganic encapsulation layer, organic encapsulation layer and a second inorganic encapsulation layer which are stacked. Because the refractive indexes of the encapsulation layer and the layers below it are basically greater than 1.5, totally reflected waveguide light exists in the encapsulation layer, and this part of waveguide light is less affected by microcavity effect, that is, the spectral peak width is larger.

As shown in FIG. 1, considering that the last layer is air, the total reflection condition of light entering the encapsulation layer is $n_1 \cdot \sin \theta_1 = n_2 \cdot \sin \theta_2 = n_3 \cdot \sin \theta_3 = n_{null} \cdot \sin 90°$, where $n_1$, $n_2$ and $n_3$ are the refractive indices of the first inorganic encapsulation layer (CVD1), the organic encapsulation layer (UP) and the second inorganic encapsulation layer (CVD2), respectively. From this calculation, the critical angle of light entering the first inorganic encapsulation layer (refractive index being 1.75) is:

$$\theta_1 = \arcsin(1/n_1) \approx 34.5°.$$

Therefore, when the angle of the light entering the first inorganic encapsulation layer is greater than or equal to 34.5 degrees, the light will be totally reflected and limited in the encapsulation layer, and this part of waveguide light has a larger spectral peak width than the light that may be normally emitted.

Figure 2A:
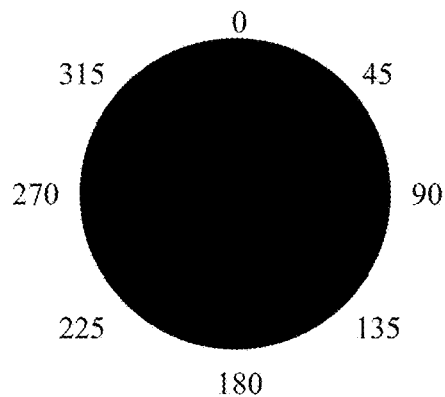
FIG. 2A is an exit pole view of a simulated waveguide light with respect to a purely planar light-emitting device.
Figure 2B:
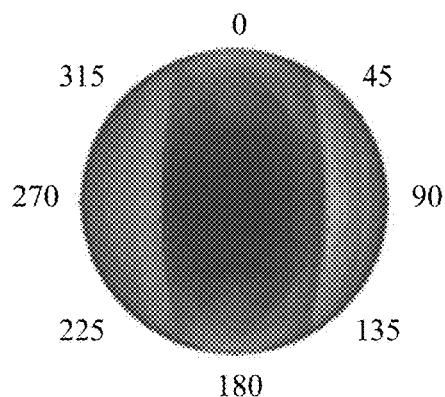
FIG. 2B is an exit pole view of a simulated waveguide light with respect to a light-emitting device with a pixel define layer slope.
Figure 3:
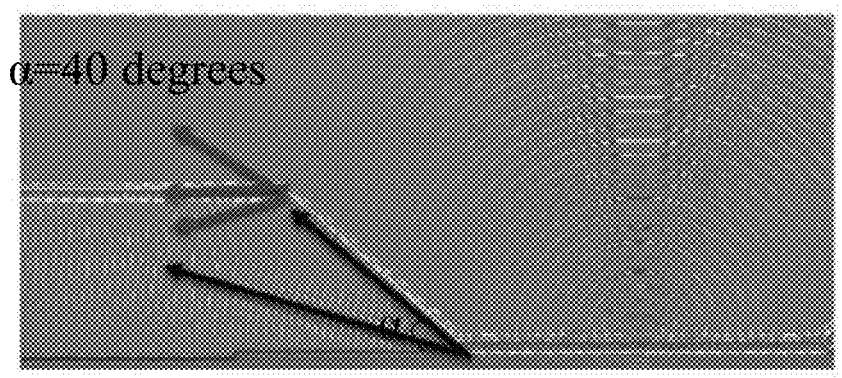
FIG. 3 is a schematic diagram of a simulated waveguide light emission direction with respect to a light-emitting device with a pixel define layer slope.

FIG. 2A is an exit pole view of a simulated waveguide light with respect to a purely planar light-emitting device, FIG. 2B is an exit pole view of a simulated waveguide light with respect to a light-emitting device with a pixel define layer slope, and FIG. 3 is a schematic diagram of emission position of simulated waveguide light with respect to a light-emitting device with a pixel define layer slope. (For example, the slope angle of the pixel define layer slope is 40°). As shown in FIG. 2A, for a purely planar light-emitting device, waveguide light cannot be emitted (all black indicates that the detected energy of emitted light is 0, that is, there is no emitted light). As shown in FIG. 2B and FIG. 3, with the pixel definition layer slope, waveguide light that cannot be emitted originally will be emitted into the air in a certain range. As shown in FIG. 3, the simulation results show that the waveguide light may exit along the slope of the pixel define layer or after passing through the upper surface of the pixel define layer.

Figure 4:
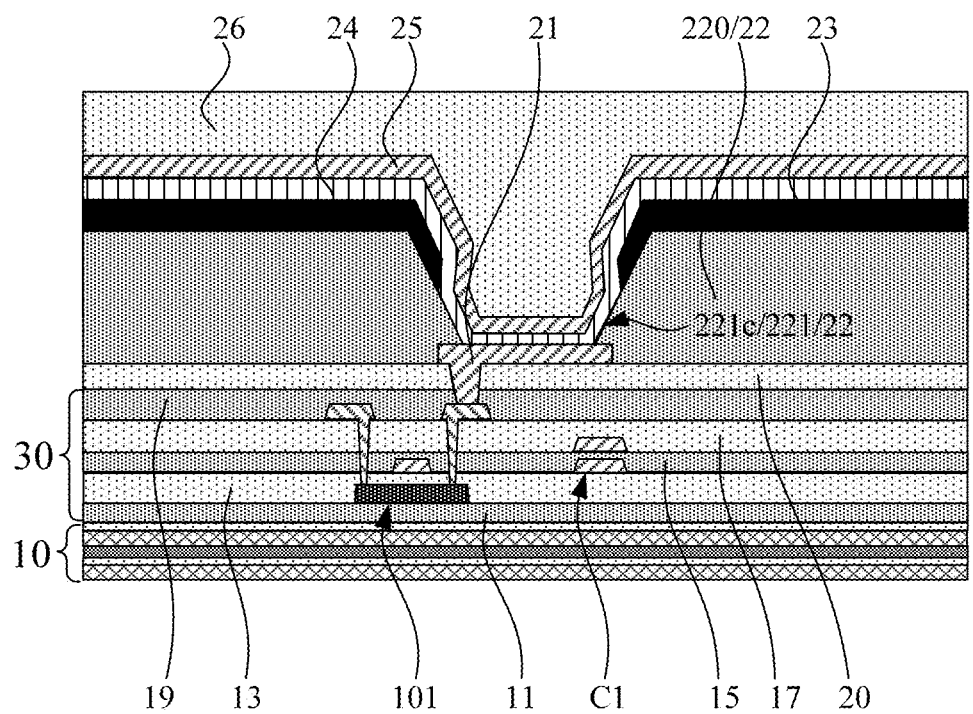
FIG. 4 is a schematic diagram of a structure of a display substrate in an exemplary embodiment of the present disclosure.
Figure 5:
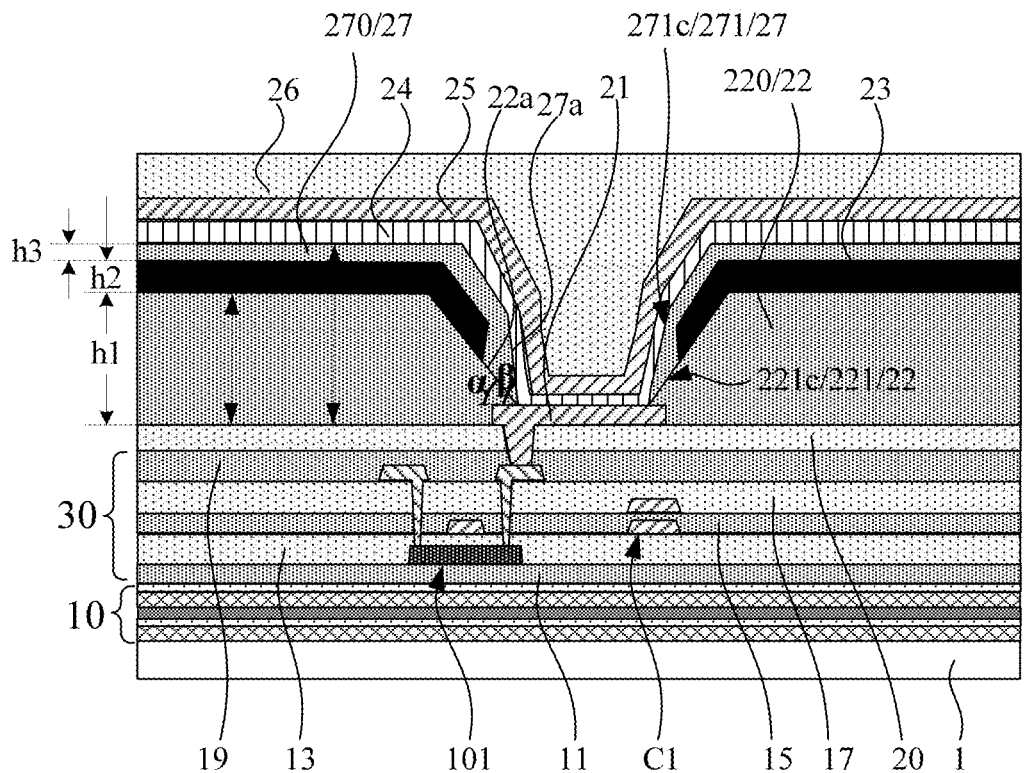
FIG. 5 is a schematic structure diagram of another display substrate in an exemplary embodiment of the present disclosure.

As shown in FIG. 4 or FIG. 5, an embodiment of the present disclosure provides a display substrate including a substrate and a plurality of pixel units disposed in matrix on the substrate, wherein each pixel unit includes a plurality of sub-pixels, and each sub-pixel includes a driving structure layer 30 on the substrate, a first electrode 21 and a first pixel define layer 22 on the driving structure layer 30, and a light absorption layer 23 disposed on the first pixel define layer 22, wherein the driving structure layer 30 includes a thin film transistor 101, and the drain electrode of the thin film transistor 101 is connected to the first electrode 21.

The first pixel define layer 22 includes a plurality of first barriers 220 and first pixel openings 221 disposed between the first barriers, the first pixel opening 221 exposes at least part of the first electrode 21, and the first pixel opening 221 includes a first surface close to the first electrode 21, a second surface opposite to the first surface and a first sidewall 221c between the first and second surfaces; the first pixel opening 221 communicates with the first surface and the second surface.

The light absorption layer 23 covers the first barriers 220 and at least part of the first sidewall 221c.

According to the display substrate provided by the present disclosure, by preparing a light absorption layer 23 on the first pixel define layer 22, the waveguide light emitted along the slope of the pixel define layer 22 or after passing through the upper surface of the pixel define layer 22 is absorbed, eliminating the influence of the broadened waveguide light spectrum on the forward light emission spectrum, which effectively avoids the visual role deviation of the display substrate and improves the display quality.

In an exemplary embodiment, the substrate may be a flexible substrate 10, or the substrate may be a rigid substrate, which is not limited by the present disclosure.

In an exemplary embodiment, each sub-pixel includes a first electrode 21, a second electrode 25, and an organic light-emitting layer 24 disposed between the first electrode 21 and the second electrode 25. The organic light-emitting layer 24 covers at least the first electrode 21, the organic light-emitting layer 24 is connected to the first electrode 21, and the second electrode 25 is connected to the organic light-emitting layer 24.

In an exemplary embodiment, the organic light-emitting layer 24 is continuously formed on a plurality of sub-pixels; or, the organic light-emitting layers 24 on a plurality of sub-pixels are disconnected by the first barrier 220 of the first pixel define layer 22.

In an exemplary embodiment, the edge of an orthographic projection of the light absorption layer 23 on the substrate coincides with the edge of an orthographic projection of the first surface on the substrate, or is located outside the orthographic projection of the first surface on the substrate; and the edge of the orthographic projection of the light absorption layer 23 on the substrate is located within an orthographic projection of the second surface on the substrate.

In an exemplary embodiment, the distance between the edge of the orthographic projection of the light absorption layer 23 on the substrate and the edge of the orthographic projection of the first surface on the substrate may be 0.5 micrometers to 1.5 micrometers. Exemplarily, the distance between the edge of the orthographic projection of the light absorption layer 23 on the substrate and the edge of the orthographic projection of the first surface on the substrate is about 1 micrometer. That is, the light absorption layer 23 is retracted about 1 micron from the first surface, so that the light absorption layer 23 does not affect the aperture ratio of the display substrate.

As shown in FIG. 5, in an exemplary embodiment, the display substrate further includes a second pixel define layer 27 disposed on the light absorption layer 23, the second pixel define layer 27 covers the light absorption layer 23, and a cavity is formed between the second pixel define layer 27 and the first pixel define layer 22, in which the light absorption layer 23 is disposed in. The second pixel define layer 27 includes a plurality of second barriers 270 and second pixel openings 271 disposed between the second barriers 270, and the second pixel openings 271 expose at least part of the first electrode 21.

In an exemplary embodiment, the second pixel opening 271 includes a third surface close to the first electrode 21, a fourth surface opposite to the third surface and a second sidewall 271c between the third surface and fourth surface; the second pixel opening 271 communicates with the third surface and the fourth surface;

the orthographic projection of the third surface on the substrate is overlapped with the orthographic projection of the first surface on the substrate, or is within the range of the orthographic projection of the first surface on the substrate.

In an exemplary embodiment, the first sidewall 221c forms a first slope angle α with the plane on which the substrate is located, and the second sidewall 271c includes a first side surface close to the first electrode and a second side surface away from the first electrode; the first side surface forms a second slope angle β with the plane on which the substrate is located, and the second slope β angle is greater than the first slope angle α.

In an exemplary embodiment, the first slope angle α is 0 to 35 degrees, and the second slope angle β is greater than the first slope angle α and less than 63 degrees.

In an exemplary embodiment, the first pixel define layer 22 has a thickness h1 of 0.5 to 1.5 microns, the light absorption layer 23 has a thickness h2 of 0.5 to 1 micron, and the second pixel define layer 27 has a thickness h3 of 0.2 to 0.6 microns.

In this embodiment, the thickness h1 of the first pixel define layer 22 and the thickness h3 of the second pixel define layer 27 need to ensure the coating uniformity and make the first slope angle α and the second slope angle β as small as possible at the same time. The thickness h2 of the light absorption layer 23 needs to ensure the coating uniformity and make the thickness as small as possible at the same time, so as to minimize or avoid the generation of residual glue of the light absorption layer on the first electrode 21.

In an exemplary embodiment, the light absorption layer 23 may be made of a light absorbing material or a pixel define layer material doped with light absorbing particles, wherein the light absorbing particles may be carbon black particles or black chromium particles, and the pixel define layer material may be polyimide, acrylic or polyethylene terephthalate.

As shown in FIG. 4 or FIG. 5, in direction perpendicular to the plane of the display substrate, the display substrate of the present disclosure includes a substrate, a driving structure layer 30 disposed on the substrate, a first planarization layer 20 disposed on the driving structure layer 30, and a light-emitting structure layer disposed on the first planarization layer 20.

The driving structure layer 30 includes: a first insulating layer 11 disposed on the substrate, an active layer disposed on the first insulating layer 11, a second insulating layer 13 covering the active layer, a first gate metal layer disposed on the second insulating layer 13, a third insulating layer 15 covering the first gate metal layer, a second gate metal layer disposed on the third insulating layer 15, a fourth insulating layer 17 covering the second gate metal layer, a source/drain metal layer disposed on the fourth insulating layer 17 and a fifth insulating layer 19 covering the source/drain metal layer. The active layer includes at least a first active layer, the first gate metal layer includes at least a first gate electrode and a first capacitor electrode, the second gate metal layer includes at least a second capacitor electrode, and the source/drain metal layer includes at least a first source electrode, a first drain electrode and a low voltage line; the first active layer, the first gate electrode, the first source electrode and the first drain electrode form a first transistor 101, and the first capacitor electrode and the second capacitor electrode form the first storage capacitor C1.

The light-emitting structure layer includes a first electrode 21 and a first pixel define layer 22 disposed on the first planarization layer 20, a light absorption layer 23 disposed on the first pixel define layer 22, an organic light-emitting layer 24 at least disposed on the first electrode 21, a second electrode 25 disposed on the organic light-emitting layer 24, and an encapsulation layer 26 disposed on the second electrode 25.

A structure of a display substrate according to the present disclosure is described below by an example of a preparation process of a display substrate. The "patterning process" mentioned in the present disclosure includes processes, such as film layer deposition, photoresist coating, mask exposure, development, etching, and photoresist stripping. The deposition may be selected as any one or more of sputtering, evaporation and chemical vapor deposition, the coating may be selected as any one or more of spraying and spin coating, and etching may be selected as any one or more of dry etching and wet etching. A "thin film" refers to a layer of thin film manufactured by deposition or coating of a certain material on a substrate. If the "thin film" does not need a patterning process during the whole manufacturing process, the "thin film" may also be called a "layer". When the "thin film" needs to be subjected to a patterning process during the whole manufacturing process, a "thin film" is referred to as a "thin film" prior to the patterning process and as a "layer" after the patterning process. The "layer" after the patterning process contains at least one "pattern". In the present disclosure, "A and B are provided on the same layer" means that A and B are formed at the same time by the same patterning process. "An orthographic projection of A contains an orthographic projection of B" means that the orthographic projection of B falls within the scope of the orthographic projection of A, or the orthographic projection of A covers the orthographic projection of B.

In some exemplary embodiments, the preparation process of the display substrate shown in FIG. 4 may include the following acts.

(1) A flexible substrate 10 is prepared on a glass carrier plate 1.

Figure 6:
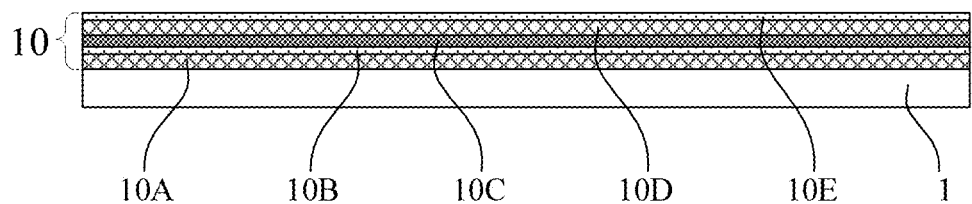
FIG. 6 is a schematic diagram of a structure of a display substrate after a flexible substrate is formed in an exemplary embodiment of the present disclosure.

In an example of the embodiment of the present disclosure, the flexible substrate 10 may have a two-layer flexible layer structure. The flexible substrate 10 includes a first flexible material layer, a first inorganic material layer, a semiconductor layer, a second flexible material layer and a second inorganic material layer which are stacked on the glass carrier plate 1. The first flexible material layer and the second flexible material layer may be made of polyimide (PI), polyethylene terephthalate (PET) or polymer soft film after surface treatment. The first inorganic material layer and the second inorganic material layer may be made of silicon nitride (SiNx) or silicon oxide (SiOx) to improve the water and oxygen resistance capability of the substrate. The first inorganic material layer and the second inorganic material layer may be called Barrier layers. The semiconductor layer may be made of amorphous silicon (a-si). In an exemplary embodiment, taking a laminated structure PI1/Barrier1/a-si/PI2/Barrier2 as an example, the preparation process of the flexible substrate 10 may include: first coating a layer of polyimide on the glass carrier plate 1, and then forming a first flexible (PI1) layer 10A after the polyimide is cured and forms a film; then, depositing a layer of barrier thin film on the first flexible layer 10A to form a first barrier layer 10B covering the first flexible layer 10A; then, depositing a layer of amorphous silicon thin film on the first barrier layer 10B to form an amorphous silicon (a-si) layer 10C covering the first barrier layer 10B; then, coating a layer of polyimide on the amorphous silicon layer 10C, and forming a second flexible (PI2) layer 10D after the polyimide is cured and forms a film; then, depositing a layer of barrier thin film on the second flexible layer 10D to form a second barrier (Barrier2) layer 10E covering the second flexible layer 10D, thus completing the preparation of the flexible substrate 10, which is as shown in FIG. 6.

In other examples, the flexible substrate 10 may have a structure of one layer of flexible layer. For example, the flexible substrate 10 includes a flexible (PI) layer and a barrier layer which are stacked. The flexible substrate 10 of this example may be left with only the second flexible (PI2) layer 10D and the second barrier (Barrier 2) layer 10E that are stacked, after removing the first flexible (PI1) layer 10A, the first barrier (Barrier1) layer 10B, and the amorphous silicon (a-si) layer 10C in FIG. 6.

Figure 7:
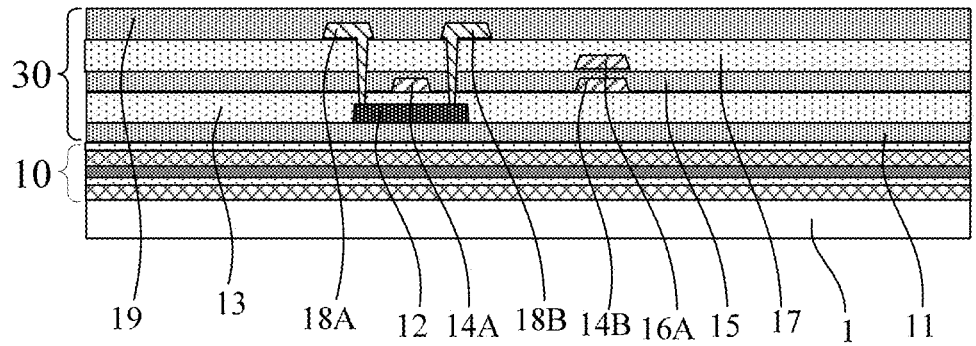
FIG. 7 is a schematic diagram of a structure of a display substrate after a driving structure layer is formed in an exemplary embodiment of the present disclosure.

(2) A pattern of the driving structure layer is prepared on the flexible substrate 10. In an exemplary embodiment, as shown in FIG. 7, the preparation process of this act may include:

a first insulation thin film and an active layer thin film are sequentially deposited on the flexible substrate 10 and the active layer thin film is patterned by a patterning process to form a first insulation layer 11 capping the entire flexible substrate 10 and an active layer pattern on the first insulation layer 11, the active layer pattern is formed in the display region, and at least includes a first active layer 12.

Then, a second insulation thin film and a first metal thin film are sequentially deposited and the first metal thin film is patterned by a patterning process to form a second insulation layer 13 covering the active layer pattern and a first gate metal layer pattern disposed on the second insulation layer 13, the first gate metal layer pattern being formed in the display region and includes at least a first gate electrode 14A and a first capacitor electrode 14B.

Then, a third insulation thin film and a second metal thin film are sequentially deposited and the second metal thin film is patterned by a patterning process to form a third insulation layer 15 covering the first gate metal layer and a second gate metal layer pattern disposed on the third insulation layer 15, the second gate metal layer pattern being formed in the display region and at least including a second capacitor electrode 16A, the position of which corresponds to that of the first capacitor electrode 14B.

Subsequently, a fourth insulating thin film is deposited, and the fourth insulating thin film is patterned through a patterning process to form a pattern of the fourth insulating layer 17 covering the second gate metal layer. The fourth insulating layer 17 is provided with a plurality of first vias, and the positions of the plurality of first vias respectively correspond to the positions of the two ends of the first active layer 12. The fourth insulating layer 17, the third insulating layer 15 and the second insulating layer 13 in the plurality of first vias are etched away, exposing the surfaces of the two ends of the first active layer 12, respectively.

Then, a third metal thin film is deposited, the third metal thin film is patterned through a patterning process to form a pattern of a source and drain metal layer on the fourth insulating layer 17, wherein the source and drain metal layer at least include patterns of a first source electrode 18A, a first drain electrode 18B, low voltage (VSS) line (not shown), a plurality of data lines (not shown) and a plurality of data leads (not shown), the first source electrode 18A and the first drain electrode 18B are respectively connected through a first via to the first active layer 12. In an exemplary embodiment, according to actual needs, the source/drain metal layer may also include any one or more of a power supply line (VDD), a compensation line and an auxiliary cathode, and the source/drain metal layer is also called a first source/drain metal layer (SD1).

Then, a fifth insulating thin film is deposited to form a pattern of a fifth insulating layer 19 covering the source/drain metal layer.

At this point, the driving structure layer pattern is prepared on the flexible substrate 10, which is as shown in FIG. 7. The first active layer 12, the first gate electrode 14A, the first source electrode 18A, and the first drain electrode 18B form a transistor 101, which may be a drive transistor in a pixel drive circuit. The first capacitor electrode 14B and the second capacitor electrode 16A form a storage capacitor C1, and a plurality of gate leads and data leads form driving leads for the gate driver on array (GOA) of the array substrate.

In an exemplary embodiment, the first insulating thin film, the second insulating thin film, the third insulating thin film, the fourth insulating thin film and the fifth insulating thin film may be made of any one or more of silicon oxide (SiOx), silicon nitride (SiNx) and silicon oxynitride (SiON), and may be a single layer, multiple layers or a composite layer. The first insulating layer 11 is referred to as a buffer layer to improve the moisture and oxygen resistance of the flexible substrate 10, the second insulating layer 13 and the third insulating layer 15 are called gate insulating (GI) layer, the fourth insulating layer 17 is referred to as interlayer insulating (ILD) layer, and the fifth insulating layer 19 is referred to as passivation (PVX) layer. The first metal thin film, the second metal thin film and the third metal thin film may be made of metal materials, such as any one or more of silver (Ag), copper (Cu), aluminum (Al), titanium (Ti) and molybdenum (Mo), or alloy materials of the above metals, such as aluminum neodymium alloy (AlNd) or molybdenum niobium alloy (MoNb), and may have a single-layer structure or a multi-layer composite structure, such as Ti/Al/Ti. The active layer thin film may be made of various materials such as amorphous indium gallium zinc oxide (a-IGZO), zinc oxynitride (ZnON), indium zinc tin oxide (IZTO), amorphous silicon (a-Si), polysilicon (p-Si), hexathiophene and polythiophene, that is, the present disclosure is applicable to transistors manufactured based on an oxide technology, a silicon technology and organics technology.

Figure 8:
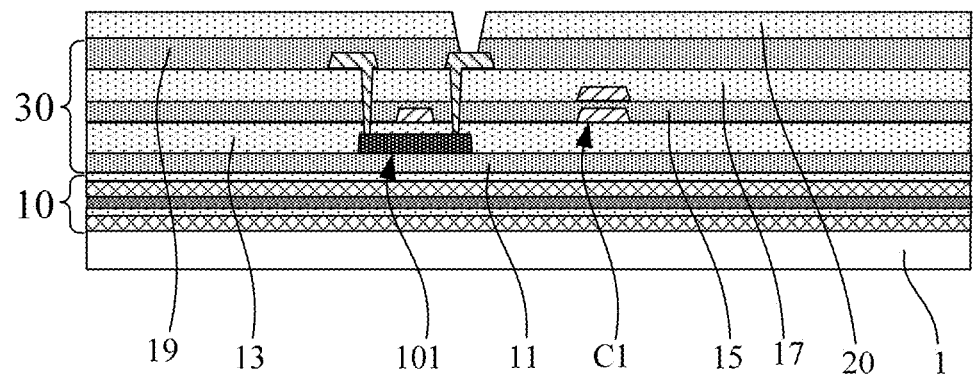
FIG. 8 is a schematic diagram of a structure of a display substrate after a first planarization layer is formed in an exemplary embodiment of the present disclosure.

(3) A first flat thin film is coated on the flexible substrate on which the aforementioned patterns are formed to form a first planarization (PLN) layer 20 covering the entire flexible substrate 10, a second via is formed on the first planarization layer 20 through a patterning process, wherein the first planarization layer 20 and a fifth insulating later 19 in the second via are etched away to expose a surface of a drain electrode of the thin film transistor 101, as shown in FIG. 8.

Figure 9:
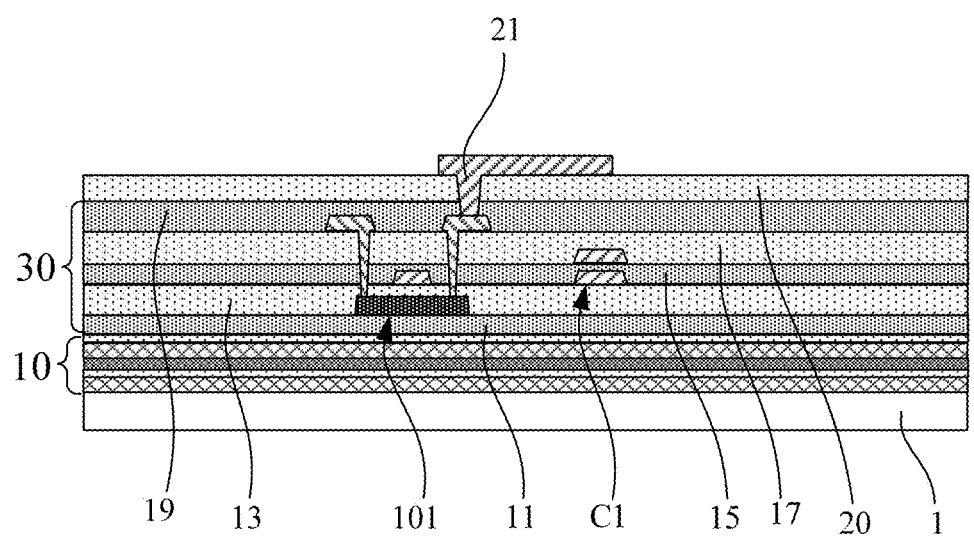
FIG. 9 is a schematic diagram of a structure of a display substrate after a first electrode is formed in an exemplary embodiment of the present disclosure.

(4) A pattern of the first control electrode 21 is formed on the flexible substrate on which the aforementioned patterns are formed. Forming of the pattern of the first electrode 21 may include: depositing a first metal thin film on the flexible substrate on which the aforementioned patterns are formed, coating a layer of photoresist on the first metal thin film, exposing the photoresist with a single tone mask, forming an unexposed region at a position where the first electrode is located, forming a completely exposed region at other positions, developing and removing the photoresist at the completely exposed region, then etching the first metal thin film at the completely exposed region and stripping the photoresist to form the pattern of the first electrode 21, wherein the first electrode 21 of each sub-pixel is connected to the drain electrode of the thin film transistor 101 in the sub-pixel, as shown in FIG. 9. Since the OLED panel of this embodiment is a top emission structure, the first electrode 21 is a reflective electrode and may be made of metals with high reflectivity, such as silver Ag, gold Au, palladium Pd, platinum Pt, etc., or alloys of these metals, or composite layers of these metals. In practice, a composite layer structure of indium tin oxide ITO layer and metal reflective layer may alternatively be adopted, which has good conductivity, high reflectivity and good morphological stability.

Figure 10:
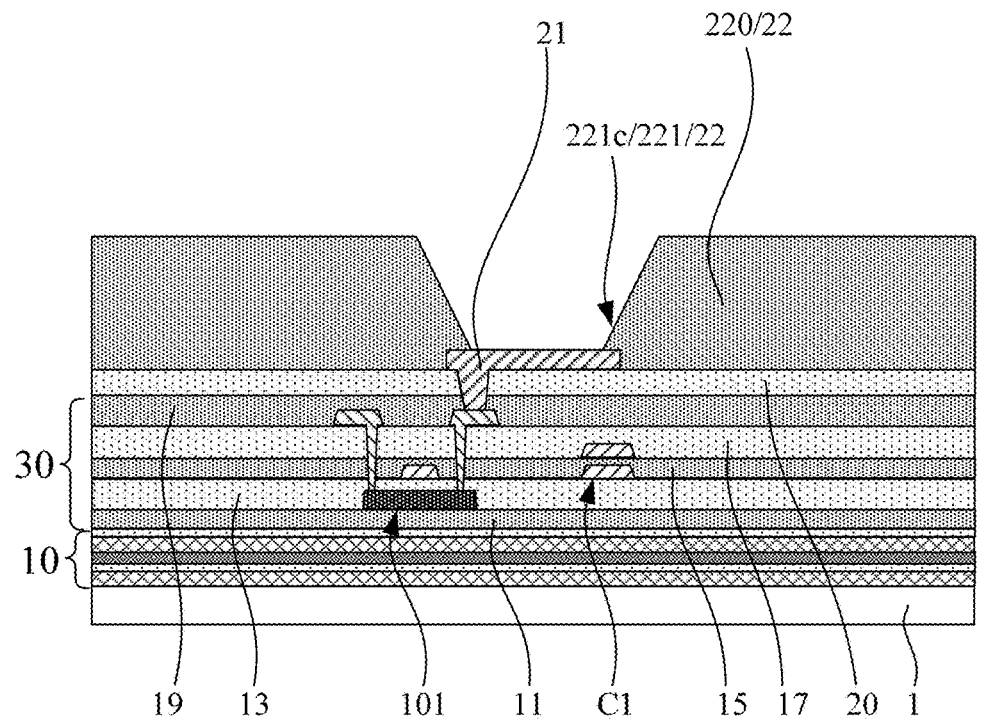
FIG. 10 is a schematic diagram of a structure of a display substrate after a first pixel define layer is formed in an exemplary embodiment of the present disclosure.

(5) A pattern of the first pixel define layer 22 is formed on the flexible substrate on which the aforementioned patterns are formed. Forming of the pattern of the first pixel define layer 22 may include: coating a layer of first pixel define thin film on the flexible substrate on which the aforementioned patterns are formed, and exposing and developing the first pixel define thin film with a single tone mask to form a pattern of the first pixel define layer 22, as shown in FIG. 10. The first pixel define layer 22 is used to define a first pixel opening region in each sub-pixel, and the first pixel opening region exposes the first electrode 21. In an exemplary embodiment, the first pixel define layer may be made of polyimide, acrylic or polyethylene terephthalate.

Figure 11:
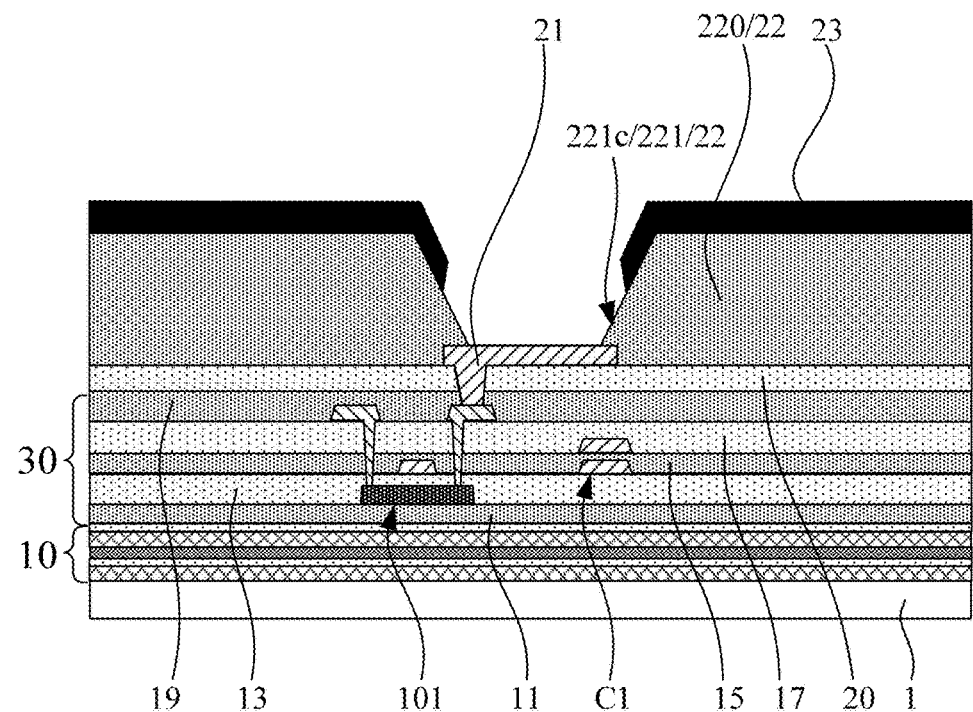
FIG. 11 is a schematic diagram of a structure of a display substrate after a light absorption layer is formed in an exemplary embodiment of the present disclosure.
Figure 12:
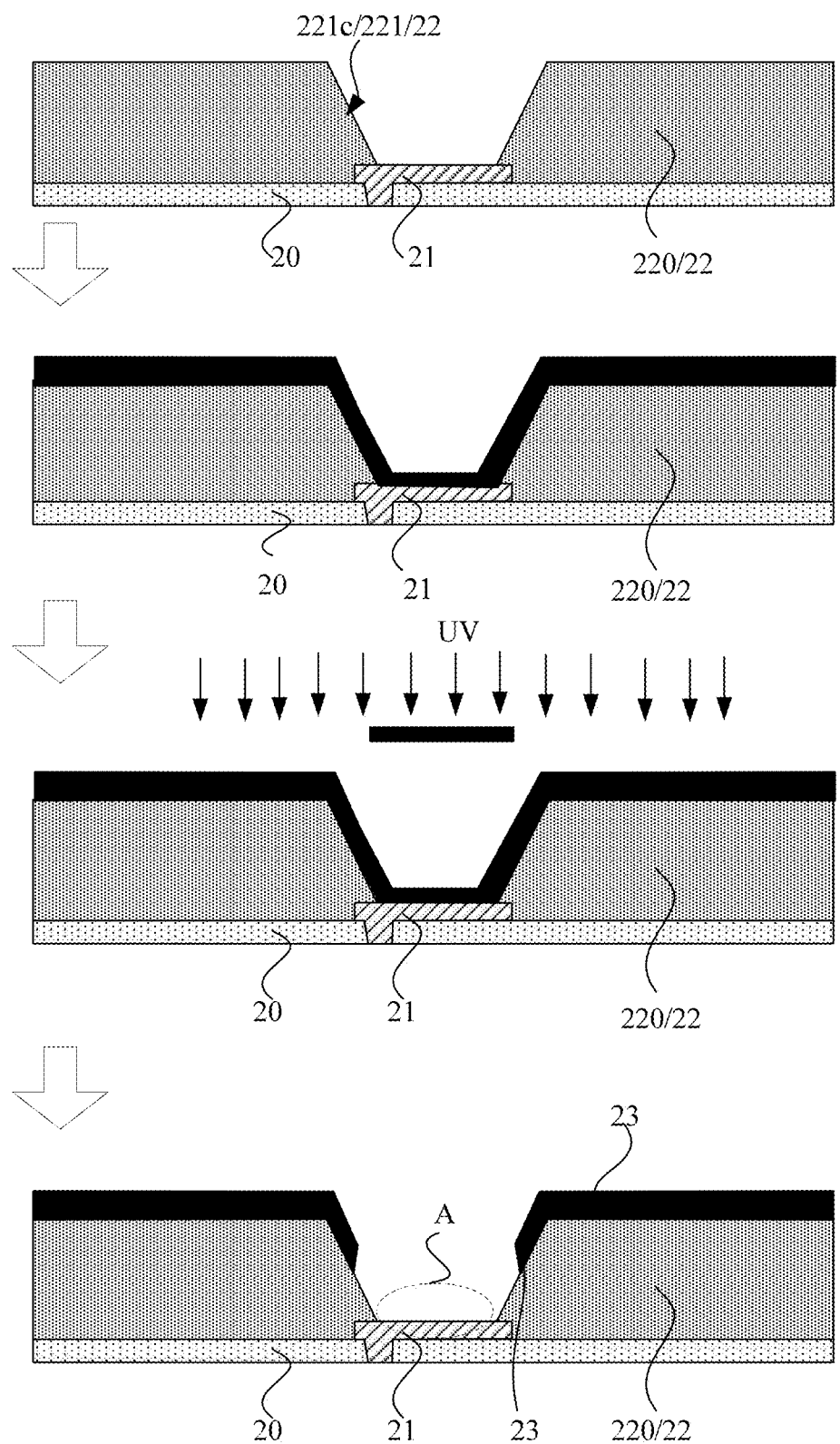
FIG. 12 is a schematic flowchart of a preparation process for a light absorption layer of an exemplary embodiment of the present disclosure.

(6) A pattern of a light absorption layer 23 is formed on the flexible substrate on which the aforementioned patterns are formed, as shown in FIG. 11 As shown in FIG. 12, forming of the pattern of the light absorption layer 23 may include: coating a negative black matrix thin film on the flexible substrate on which the aforementioned patterns are formed, and exposing and developing the negative black matrix thin film with a single tone mask to form the pattern of the light absorption layer 23. In other examples, the light absorption layer 23 may alternatively be formed by a pixel define layer material doped with light absorbing particles. The light absorbing particles may be carbon black particles or black chromium particles.

In an exemplary embodiment, The first pixel define layer 22 includes a plurality of first barriers 220 and first pixel openings 221 disposed between the first barriers, the first pixel opening 221 exposes at least part of the first electrode 21, and the first pixel opening 221 includes a first surface close to the first electrode 21, a second surface opposite to the first surface and a first sidewall 221c between the first and second surfaces; the first pixel opening 221 communicates with the first surface and the second surface. The light absorption layer 23 covers the first barriers 220 and at least part of the first sidewall 221c.

In an exemplary embodiment, the edge of an orthographic projection of the light absorption layer 23 on the flexible substrate 10 coincides with the edge of an orthographic projection of the first surface on the flexible substrate 10, or is located outside the orthographic projection of the first surface on the flexible substrate 10; and the edge of the orthographic projection of the light absorption layer 23 on the flexible substrate 10 is located within an orthographic projection of the second surface on the flexible substrate 10.

In an exemplary embodiment, the distance between the edge of the orthographic projection of the light absorption layer 23 on the flexible substrate 10 and the edge of the orthographic projection of the first surface on the flexible substrate 10 is 0.5 micrometers to 1.5 micrometers.

Figure 13:
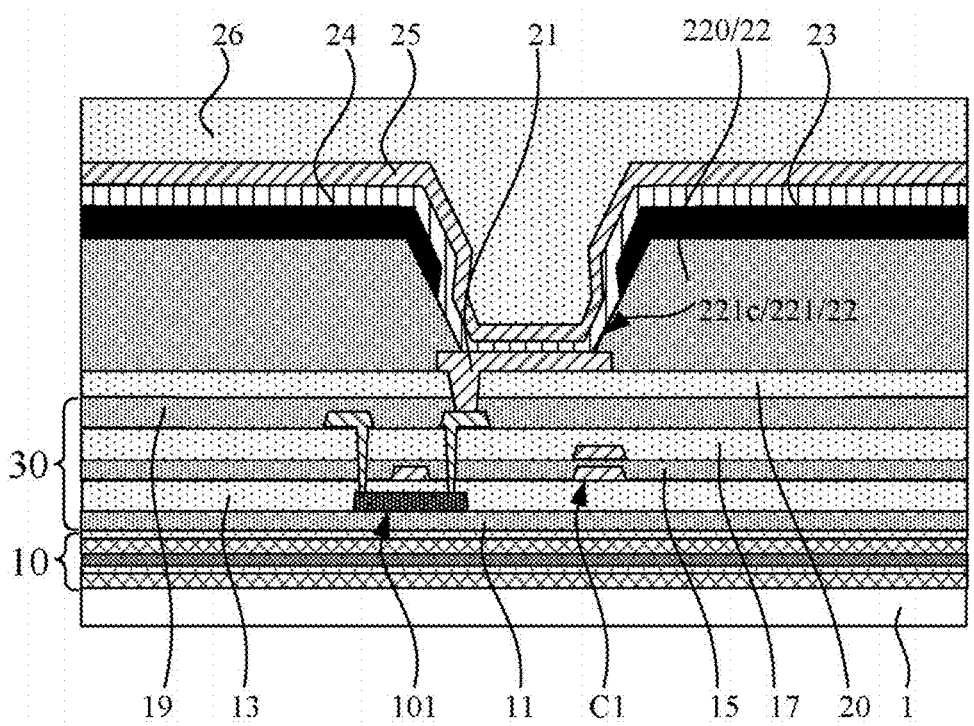
FIG. 13 is a schematic diagram of a structure of a display substrate after an encapsulation layer is formed in an exemplary embodiment of the present disclosure.

(7) An organic light-emitting layer 24, a second electrode 25 and an encapsulation layer 26 are formed in turn on the substrate on which the aforementioned patterns are formed, as shown in FIG. 13. The organic light-emitting layer 24 is connected to the first electrode 21 in each pixel opening region. Since the first electrode 21 is connected to the drain electrode of the first transistor 101, the light-emitting control of the organic light-emitting layer 24 is achieved. The organic light-emitting layer 24 may include a hole injection layer, a hole transporting layer, a light-emitting layer, an electron transporting layer, and an electron injection layer that are stacked. The second electrode 25 is formed on the organic light-emitting layer 24 and is connected to the organic light-emitting layer 24. In an exemplary embodiment, the second electrode 26 may be made of any one or more of magnesium (Mg), silver (Ag), aluminum (Al), copper (Cu) and lithium (Li), or an alloy made of any one or more of the above metals.

An encapsulation layer 26 is formed on the flexible substrate 10 on which the aforementioned patterns are formed. The encapsulation layer 26 may include a first inorganic encapsulation layer, an organic encapsulation layer, and a second inorganic encapsulation layer that are stacked.

(8) The flexible substrate 10 on which the thin film layer is formed is peeled off from the glass carrier plate 1, and an auxiliary thin film layer such as a back thin film is attached to the surface of the flexible substrate 10 facing away from the display side to obtain the display substrate of this embodiment, as shown in FIG. 4.

In an exemplary embodiment, the display substrate may further include a touch layer or a touch panel disposed on the encapsulation layer and a protective layer (OC) covering the touch layer or the touch panel. In another exemplary embodiment, the display substrate region may further include a temporary protect film (abbreviated as TPF), which is attached to the encapsulation layer, and is used for protecting the film layer structure of the display substrate. The operation of attaching the back film is performed after the protective film is attached.

As shown in FIG. 6 to FIG. 13, a display substrate provided by the present disclosure includes:
- a flexible substrate 10, wherein the flexible substrate 10 includes a first flexible layer 10A, a first barrier layer 10B, an amorphous silicon (a-si) layer 10C, a second flexible layer 10D and a second barrier layer 10E which are sequentially stacked;
- a first insulating layer 11 disposed on the flexible substrate 10;
- an active layer disposed on the first insulating layer 11, the active layer at least includes a first active layer 12;
- a second insulating layer 13 covering the active layer;
- a first gate metal layer disposed on the second insulating layer 13, the first gate metal layer including at least a first gate electrode 14A and a first capacitor electrode 14B;
- a third insulating layer 15 covering the first metal gate layer;
- a second gate metal layer disposed on the third insulating layer 15, the second gate metal layer including at least a second capacitor electrode 16A;
- a fourth insulating layer 17 covering the second gate metal layer, the fourth insulating layer 17 is provided with a plurality of first vias, and the plurality of first vias exposes two ends of the first active layer 12 respectively;
- a source/drain metal layer disposed on the fourth insulating layer 17, the source/drain metal layer includes at least a first source electrode 18A and a first drain electrode 18B, the first source electrode 18A and the first drain electrode 18B are connected to the two ends of the first active layer 12 through the first via;
- a fifth insulating layer 19 covering the source/drain metal layers;
- a first planarization layer 20 covering the aforementioned structures, on the first planarization layer 20 a second via exposing the first drain electrode 18B is provided;
- a first electrode 21 disposed on the first planarization layer 20, wherein the first electrode 21 is connected to the first drain electrode 18B through the second via;
- a first pixel define layer 22 disposed on the first planarization layer 20, wherein the first pixel define layer 22 includes a plurality of first barriers 220 and first pixel openings 221 disposed between the first barriers, the first pixel opening 221 exposes at least part of the first electrode 21, and the first pixel opening 221 includes a first surface close to the first electrode 21, a second surface opposite to the first surface and a first sidewall 221c between the first and second surfaces; the first pixel opening 221 communicates with the first surface and the second surface;
- a light absorption layer 23 disposed on the pixel define layer 22, wherein the light absorption layer 23 covers the first barriers 220 and at least part of the first sidewall 221c;
- an organic light-emitting layer 24 covering at least the first electrode 21, the organic light-emitting layer 24 is connected to the first electrode 21;
- a second electrode 25 disposed on the organic light-emitting layer 24, the second electrode 25 is connected to the organic light-emitting layer 24;
- and an encapsulation layer 26 disposed on the second electrode 25.

It may be seen from the structure and preparation process of the display substrate provided by the present disclosure that, by preparing a light absorption layer on the pixel define layer, the waveguide light emitted along the slope of the pixel define layer or after passing through the upper surface of the pixel define layer is absorbed, eliminating the influence of the broadened waveguide light spectrum on the forward light emission spectrum, which effectively avoids the visual angle deviation occurs in the display substrate and improves the display quality.

The description of the structure and preparation process of the display substrate according to the present disclosure is merely illustrative. In an exemplary embodiment, according to actual needs corresponding structures may be changed and patterning processes may be added or reduced. For example, the OLED may have a top emission structure, or may have a bottom emission structure. For another example, the driving transistor may have a top gate structure, a bottom gate structure, or a single gate structure, or a dual gate structure. For another example, other electrodes, leads, and structural film layers may be disposed in the driving structure layer, and the present application is not specifically limited thereto.

Figure 14:
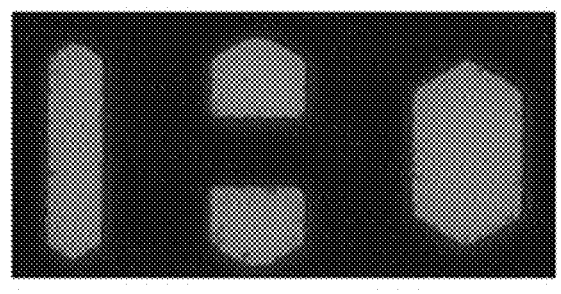
FIG. 14 is a schematic diagram of light absorption layer residual glue in an exemplary embodiment of the present disclosure.

As shown in FIG. 12, when preparing the light absorption layer 23 on the first pixel define layer 22, since the light absorption layer 23 has poor light transmittance, and the lower light absorption layer material (i.e., the light absorption layer material located at position A in the figure) receives weak light, and the residual glue of the light absorption layer easily appears at position A during etching. An exemplary residual glue of the light absorption layer is shown in FIG. 14. The residual glue of the light absorption layer on the first electrode 21 will affect the lighting of OLED materials, and eventually undermines the device performance.

Figure 15:
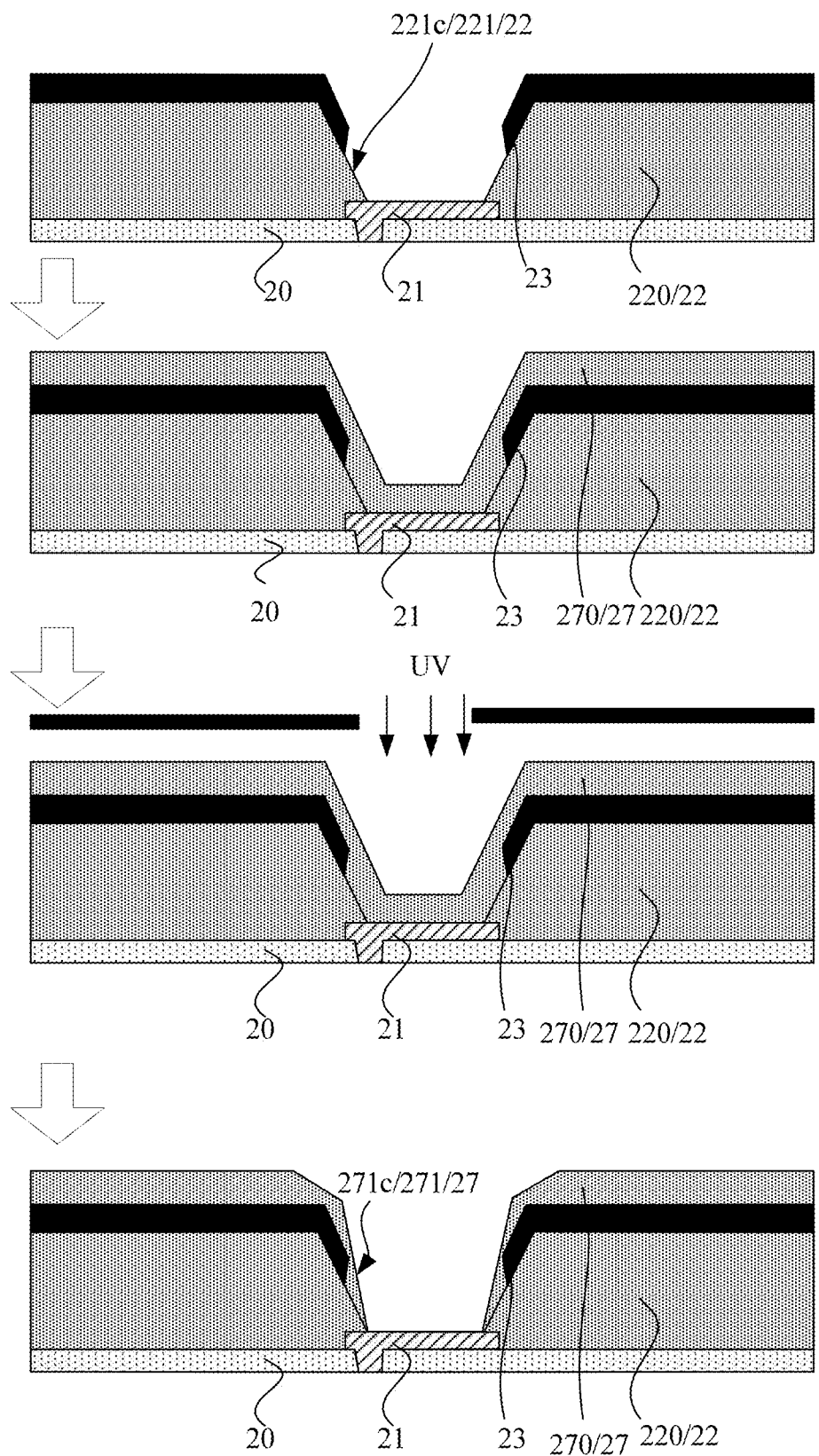
FIG. 15 is a schematic flowchart of a preparation process of a second pixel define layer of an exemplary embodiment of the present disclosure.

Therefore, in the preparation process, a pattern of a second pixel define layer may be formed after act (6) and before act (7), and the structure of the display substrate shown in FIG. 5 may be obtained. As shown in FIG. 15, forming of a pattern of the second pixel define layer may include: coating a layer of second pixel define thin film on the flexible substrate 10 on which the aforementioned patterns are formed, and exposing and developing the second pixel define thin film with a single tone mask to form a pattern of the second pixel define layer 27. The second pixel define layer 27 covers the light absorption layer 23, and a cavity is formed between the second pixel define layer 27 and the first pixel define layer 22, in which the light absorption layer 23 is disposed in. The second pixel define layer 27 includes a plurality of second barriers 270 and second pixel openings 271 disposed between the second barriers 270, and the second pixel openings 271 expose at least part of the first electrode 21. In an exemplary embodiment, the second pixel define layer may be made of polyimide, acrylic or polyethylene terephthalate.

In the display substrate provided in this embodiment, two pixel define layers (the first pixel define layer 22 and the second pixel define layer 27) are prepared, and the light absorption layer 23 is sandwiched between the two pixel define layers, which achieves the technical effects of the previous embodiment, which includes the waveguide light emitted along the slope of the pixel define layer or after passing through the upper surface of the pixel define layer is absorbed, eliminating the influence of the broadened waveguide light spectrum on the forward light emission spectrum, which effectively avoids the visual angle deviation occurs in the display substrate and improves the display quality. At the same time, the residual light absorption layer on the first electrode 21 is removed when the second pixel define layer 27 is prepared, and the chamber is prevented from being polluted because of ashing of the light absorption layer.

Figure 16:
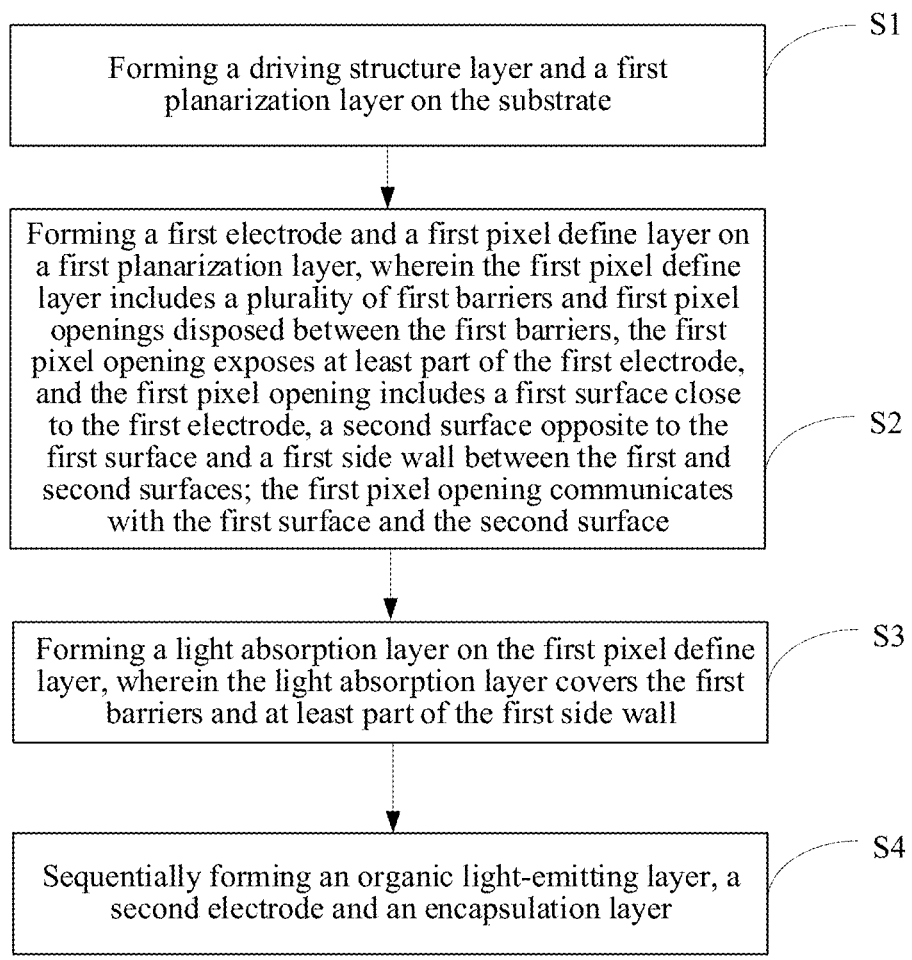
FIG. 16 is a schematic flowchart of a preparation method for a display substrate of an exemplary embodiment of the present disclosure.

The present disclosure further provides a method for preparing a display substrate. As shown in FIG. 16, the preparation method of the display substrate provided by the present disclosure includes:
- S1, forming a driving structure layer and a first planarization layer on the substrate;
- S2, forming a first electrode and a first pixel define layer on a first planarization layer, wherein the first pixel define layer includes a plurality of first barriers and first pixel openings disposed between the first barriers, the first pixel opening exposes at least part of the first electrode, and the first pixel opening includes a first surface close to the first electrode, a second surface opposite to the first surface and a first sidewall between the first and second surfaces; the first pixel opening communicates with the first surface and the second surface;
- S3, forming a light absorption layer on the first pixel define layer, wherein the light absorption layer covers the first barriers and at least part of the first sidewall;
- S4, sequentially forming an organic light-emitting layer, a second electrode and an encapsulation layer.

In an exemplary embodiment, the first pixel define layer is formed by a positive photolithography technique, and the light absorption layer is formed by a negative photolithography technique.

For example, the first pixel define layer may be formed by a positive dry etching process, and the light absorption layer may be formed by a negative dry etching process.

In an exemplary embodiment, the edge of an orthographic projection of the light absorption layer on the substrate coincides with the edge of an orthographic projection of the first surface on the substrate, or is located outside the orthographic projection of the first surface on the substrate; and the edge of the orthographic projection of the light absorption layer on the substrate is located within an orthographic projection of the second surface on the substrate.

In an exemplary embodiment, prior to the sequential forming of an organic light-emitting layer, a second electrode and an encapsulation layer, the preparation method further includes:

forming a second pixel define layer on the light absorption layer, wherein the second pixel define layer covers the light absorption layer; the second pixel define layer includes a plurality of second barriers and second pixel openings disposed between the second barriers, and the second pixel openings expose at least part of the first electrode.

In an exemplary embodiment, the first pixel define layer has a thickness of 0.5 to 1.5 microns, the light absorption layer has a thickness of 0.5 to 1 micron, and the second pixel define layer has a thickness of 0.2 to 0.6 microns.

In an exemplary embodiment, the second pixel opening includes a third surface close to the first electrode, a fourth surface opposite to the third surface, and a second sidewall between the third and fourth surfaces, and the second pixel opening communicates with the third surface and the fourth surface; an orthographic projection of the third surface on the substrate is overlapped with the orthographic projection of the first surface on the substrate, or is within the range of the orthographic projection of the first surface on the substrate.

The present disclosure provides a preparation method of a display substrate. By preparing a light absorption layer on the pixel define layer, the waveguide light emitted along the slope of the pixel define layer or after passing through the pixel define layer is absorbed, eliminating the influence of the broadened waveguide light spectrum on the forward light emission spectrum, which effectively avoids the visual angle deviation occurs in the display substrate and improves the display quality. The preparation process according to the present disclosure can be achieved by using the existing mature preparation equipment, has little improvement on the existing process, can be well compatible with the existing preparation process, and has advantages of simple process realization, easy implementation, high production efficiency, low production cost and high yield rate.

The present disclosure further provides a display apparatus including the display substrate in the aforementioned embodiments. The display apparatus may be any product or component with a display function, such as a mobile phone, a tablet computer, a television, a display, a laptop computer, a digital photo frame, a navigator, etc.

The drawings of the present application are only related to the structures involved in the present disclosure, and general designs may be referred to for other structures. The embodiments of the present disclosure, i.e., features in the embodiments may be combined with each other to obtain new embodiments if there is conflict.

Those of ordinary skills in the art will understand that modifications or equivalent substitutions may be made to the technical solutions of the present disclosure without departing from the spirit and scope of the technical solutions of the present application, and shall be covered within the scope of the claims of the present application.

What is claimed is:

1. A display substrate, comprising:
   a substrate and a plurality of pixel units disposed in matrix on the substrate, wherein:
   each pixel unit comprises a plurality of sub-pixels, and each sub-pixel comprises a driving structure layer on the substrate, a first electrode and a first pixel define layer on the driving structure layer, and a light absorption layer disposed on the first pixel define layer, wherein the driving structure layer comprises a thin film transistor, and a drain electrode of the thin film transistor is connected to the first electrode;

the first pixel define layer comprises a plurality of first barriers and a first pixel opening disposed between the first barriers, the first pixel opening exposes at least part of the first electrode, and the first pixel opening comprises a first surface close to the first electrode, a second surface opposite to the first surface and a first sidewall between the first surface and second surface; the first pixel opening communicates with the first surface and the second surface;

the light absorption layer covers the first barriers and at least part of the first sidewall;

the display substrate further comprises a second pixel define layer disposed on the light absorption layer, and the second pixel define layer covers the light absorption layer;

the second pixel define layer comprises a plurality of second barriers and a second pixel opening disposed between the second barriers, and the second pixel opening exposes at least part of the first electrode;

the second pixel opening comprises a third surface close to the first electrode, a fourth surface opposite to the third surface and a second sidewall between the third surface and fourth surface; the second pixel opening communicates with the third surface and the fourth surface;

an orthographic projection of the third surface on the substrate is overlapped with an orthographic projection of the first surface on the substrate, or the orthographic projection of the third surface on the substrate is within a range of the orthographic projection of the first surface on the substrate; and the first sidewall forms a first slope angle with a plane on which the substrate is located, and the second sidewall comprises a first side surface close to the first electrode and a second side surface away from the first electrode; the first side surface forms a second slope angle with the plane on which the substrate is located, and the second slope angle is greater than the first slope angle.

2. The display substrate of claim 1, wherein an edge of an orthographic projection of the light absorption layer on the substrate coincides with an edge of an orthographic projection of the first surface on the substrate, or the edge of the orthographic projection of the light absorption layer on the substrate is located outside the orthographic projection of the first surface on the substrate; and the edge of the orthographic projection of the light absorption layer on the substrate is located within an orthographic projection of the second surface on the substrate.

3. The display substrate of claim 1, wherein the first pixel define layer has a thickness of 0.5 to 1.5 microns, the light absorption layer has a thickness of 0.5 to 1 micron, and the second pixel define layer has a thickness of 0.2 to 0.6 microns.

4. The display substrate of claim 1, wherein the light absorption layer is made of a light absorbing material or a pixel define layer material doped with light absorbing particles, wherein the light absorbing particles are carbon black particles or black chromium particles, and the pixel define layer material is polyimide, acrylic or polyethylene terephthalate.

5. A display apparatus, comprising the display substrate of claim 1.

6. A preparation method for a display substrate, comprising:

forming a driving structure layer and a first planarization layer on a substrate;

forming a first electrode and a first pixel define layer on the first planarization layer, wherein the first pixel define layer comprises a plurality of first barriers and a first pixel opening disposed between the first barriers, the first pixel opening exposes at least part of the first electrode, and the first pixel opening comprises a first surface close to the first electrode, a second surface opposite to the first surface and a first sidewall between the first surface and second surface; the first pixel opening communicates with the first surface and the second surface;

forming a light absorption layer on the first pixel define layer, wherein the light absorption layer covers the first barriers and at least part of the first sidewall; and sequentially forming an organic light-emitting layer, a second electrode and an encapsulation layer, wherein before sequentially forming the organic light-emitting layer, the second electrode and the encapsulation layer, the preparation method further comprises:

forming a second pixel define layer on the light absorption layer, wherein the second pixel define layer covers the light absorption layer; the second pixel define layer comprises a plurality of second barriers and a second pixel opening disposed between the second barriers, and the second pixel opening exposes at least part of the first electrode, wherein the second pixel opening comprises a third surface close to the first electrode, a fourth surface opposite to the third surface and a second sidewall between the third surface and fourth surface; the second pixel opening communicates with the third surface and the fourth surface;

wherein an orthographic projection of the third surface on the substrate is overlapped with an orthographic projection of the first surface on the substrate, or the orthographic projection of the third surface on the substrate is within a range of the orthographic projection of the first surface on the substrate; and wherein the first sidewall forms a first slope angle with a plane on which the substrate is located, and the second sidewall comprises a first side surface close to the first electrode and a second side surface away from the first electrode; the first side surface forms a second slope angle with the plane on which the substrate is located, and the second slope angle is greater than the first slope angle.

7. The preparation method of claim 6, wherein the first pixel define layer is formed by a positive photolithography technique, and the light absorption layer is formed by a negative photolithography technique.

8. The preparation method of claim 6, wherein an edge of an orthographic projection of the light absorption layer on the substrate coincides with an edge of an orthographic projection of the first surface on the substrate, or the edge of the orthographic projection of the light absorption layer on the substrate is located outside the orthographic projection of the first surface on the substrate; and the edge of the orthographic projection of the light absorption layer on the substrate is located within an orthographic projection of the second surface on the substrate.

* * * * *